(12) United States Patent
Kato et al.

(10) Patent No.: US 7,253,971 B2
(45) Date of Patent: Aug. 7, 2007

(54) CATADIOPTRIC PROJECTION OPTICAL SYSTEM AND EXPOSURE APPARATUS HAVING THE SAME

(75) Inventors: Takashi Kato, Utsunomiya (JP); Chiaki Terasawa, Nasu-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/255,371

(22) Filed: Oct. 20, 2005

(65) Prior Publication Data

US 2006/0082904 A1  Apr. 20, 2006

(30) Foreign Application Priority Data

Oct. 20, 2004 (JP) ............................. 2004-305248

(51) Int. Cl.
*G02B 17/08* (2006.01)
(52) U.S. Cl. .................. 359/727; 359/726; 359/364; 355/57
(58) Field of Classification Search ........ 359/754–795, 359/726, 727, 730, 732, 364, 363, 434
See application file for complete search history.

(56) References Cited

U.S. PATENT DOCUMENTS

| 5,861,997 | A | 1/1999 | Takahashi |
| 2004/0130806 | A1* | 7/2004 | Takahashi ............... 359/727 |
| 2004/0233405 | A1 | 11/2004 | Kato et al. |
| 2005/0117224 | A1 | 6/2005 | Shafer et al. |
| 2006/0028715 | A1 | 2/2006 | Kato et al. |

FOREIGN PATENT DOCUMENTS

| JP | 8-62502 | 3/1996 |
| JP | 2003-307679 | 10/2003 |
| JP | 2004-205698 | 7/2004 |
| JP | 2004-227364 | 8/2004 |
| JP | 2004-305248 | 11/2004 |

* cited by examiner

*Primary Examiner*—Scott J. Sugarman
*Assistant Examiner*—Darryl J. Collins
(74) *Attorney, Agent, or Firm*—Morgan & Finnegan, L.L.P.

(57) ABSTRACT

A catadioptric projection optical system for forming plural intermediate images of a first object and for imaging the image of the first object onto a second object, said catadioptric projection optical system includes at least one concave mirror, a first deflective reflector, and a second deflective reflector, wherein a light reflected by the first deflective reflector is directly led to the second deflective reflector.

26 Claims, 11 Drawing Sheets

CATADIOPTRIC PROJECTION OPTICAL SYSTEM AND EXPOSURE APPARATUS HAVING THE SAME

BACKGROUND OF THE INVENTION

The present invention relates generally to a projection optical system, and more particularly to a catadioptric projection optical system that projects an object, such as a single crystal substrate and a glass plate for a liquid crystal display ("LCD"), using a mirror. The present invention is suitable, for example, an immersion exposure apparatus (an immersion lithography exposure system) for exposing the object through a liquid between the projection optical system and the object.

The photolithography technology for manufacturing fine semiconductor devices, such as semiconductor memory and logic circuits, has conventionally employed a reduction projection exposure apparatus that uses a projection optical system to project and transfer a circuit pattern of a reticle (or mask) onto a wafer, etc. A more highly integrated and finer semiconductor device (circuit pattern) requires a projection optical system for a better specification and performance. Generally, a shorter wavelength of the exposure light and a higher numerical aperture ("NA") are effective to improve the resolution. Recently, an optical system with an NA of 1 or higher that utilizes an immersion optical system that fills a space with liquid between a final glass surface (in other words, the lens closet to the wafer) of the projection optical system and the wafer has been proposed, and a higher NA scheme is in progress.

For the exposure light with a short wavelength such as an ArF excimer laser (with a wavelength of approximately 193 nm) and a $F_2$ laser (with a wavelength of approximately 157 nm) for higher resolution, lens materials are limited to quartz and calcium fluoride for reduced transmittance. An optical system that includes only lenses (refracting element) uses, generally, quartz and calcium fluoride for the exposure wavelength of 193 nm for instance. However, quartz and calcium fluoride possess similar dispersive powers, and have difficulties in correcting the chromatic aberration, especially, for the optical system that has a very higher NA as in the immersion optical system. Moreover, a lens diameter increases as the NA becomes higher, and causes the increased apparatus cost.

Then, various proposals that use a mirror (reflecting element) for an optical system have been made to solve the disadvantageous reduced transmittance, difficult corrections to the chromatic aberration and large aperture of the lens. For example, a catadioptric projection optical system that combines a mirror with a lens has been disclosed. See, for example, Japanese Patent Applications, Publication Nos. 2004-205698, 8-62502 and 2003-307679.

A projection optical system that includes a mirror for a shorter exposure wavelength and a higher NA needs to correct the chromatic aberration corrections, maintain a large enough imaging area on an image surface, and have latitude for a higher NA. Especially, when the NA of higher than about 1.1 dramatically increases an object-to-image distance (in other words, a distance between a reticle and a wafer), and an effective diameter of lens inevitably enlarging the optical system and increasing the apparatus cost.

The optical system disclosed in Japanese Patent Application, Publication No. 2004-205698 propose a twice-imaging catadioptric optical system for forming an intermediate image once. The optical system includes a first imaging optical system that has a reciprocating optical system (double-pass optical system) which includes concave mirror and forms an intermediate image of a first object (e.g., a reticle), and a second imaging optical system that forms the intermediate image onto a surface of a second object (e.g., a wafer). Moreover, the optical system arranges a first plane mirror near the intermediate image for deflecting an optical axis and light. The deflected optical axis from the first plane mirror is made approximately parallel to a reticle stage and is deflected once again by a second plane mirror, and images onto the second object. The optical system disclosed in Japanese Patent Application, Publication No. 2004-205698 has the above structure, and inevitably arrange the first object (e.g., a reticle), a lens, plane mirror and the deflected light close to one another. Therefore, the optical system creates a problem of interference between the first object (e.g., a reticle) surface or the reticle stage and the lens or the plane mirror or an insufficient space. The optical system in FIG. 5 of Japanese Patent Application, Publication No. 2004-205698 is an immersion optical system with an NA of 1.05. However, a maximum effective diameter is over φ300, and if NA achieves higher NA such as 1.2 or higher, the effective diameter is remarkably enlarged.

The optical system in FIGS. 7 and 9 of Japanese Patent Application, Publication No. 8-62502 is a catadioptric optical system with an NA from 0.45 to 0.5 for forming an image three times or an intermediate image twice. The optical system includes a first imaging optical system that forms a first intermediate image of a first object (e.g., a reticle), a second imaging optical system that includes a concave mirror and forms a second intermediate image from the first intermediate image, and a third imaging optical system that images the second intermediate image onto a second object (e.g., a wafer) surface. The second imaging optical system includes concave mirrors as a reciprocating optical system. In this optical system, the first object (e.g., a reticle) and the second object (e.g., a wafer) are not arranged in parallel. The imaging performance improves in a scanning exposure, and a stability performance can be maintained when the first and second objects are arranged in parallel to each other and perpendicular to the gravity. Therefore, it is undesirable for an exposure apparatus that has an optical system with a higher NA by the immersion etc. to arrange the first object (e.g., a reticle) and second object (e.g., a wafer) in not parallel. This optical system needs another plane mirror to arrange the first object (e.g., a reticle) and second object (e.g., a wafer) in parallel. In that case, as described in Japanese Patent Application, Publication No. 8-62502, if a mirror is arranged near the first intermediate image, the arrangement is the same as the optical system in FIGS. 4 and 6 of Japanese Patent Application, Publication No. 20003-307679 described later. If an optical axis of the lens (optical element) having a refractive power is not along the gravity direction, the imaging performance deteriorates by self-weight deformations and influences of retainer. Therefore, preferably, the optical element having a refractive power with the optical axis that is not along the gravity direction does not exist as much as possible. However, the optical system in FIGS. 7 and 9 of Japanese Patent Application, Publication No. 8-62502 includes plural optical element with the optical axis that is not along the gravity direction.

The optical system with an NA of almost 0.85 in FIGS. 4 and 6 of Japanese Patent Application, Publication No. 2003-307679 arranges a plane mirror (reflection block) near the first and second intermediate images, and aligns optical axes of the first and third imaging optical systems with each other. Thus, the first object (e.g., a reticle) and the second object (e.g., a wafer) are arranged in parallel. However, such an optical system becomes considerably large when the NA becomes 1 or higher as in the immersion optical system, especially, about 1.1 or higher. Since the first imaging optical system from the first object (e.g., a reticle) to the vicinity of the plane mirror and the third imaging optical system from the vicinity of the plane mirror to the second object (e.g., a wafer) are arranged on a straight line of the optical axis, a sum of the object-to-image distance of the first imaging optical system and the object-to-image distance of the third imaging optical system becomes the the object-to-image distance (the distance between the reticle and the wafer) of the entire optical system. Due to the strong refractive power of each lens necessary to maintain the size of the optical system with a higher NA, the aberration correction becomes difficult. Moreover, because of a small reduction magnification in the first imaging optical system, the first intermediate image enlarges the NA of the first intermediate image for an object-side NA in the first object (e.g., a reticle) by the reduction magnification. As a result, both an incident angle range and the maximum incident angle upon the plane mirror increase, and a higher NA scheme as in the immersion etc. encounters a serious problem. In other words, both the incident angle range and the maximum incident angle upon the plane mirror considerably increase due to the NA of 1 or higher, and the imaging performance inevitably deteriorates by the influence of a deteriorated property of the plane mirror etc. Because the plane mirror is also arranged near the second intermediate image, this is true of the second intermediate image. Moreover, as the above-mentioned, optical axes of the concave mirror and the negative lens in the second imaging optical system are perpendicular to the gravity direction, and it is not desirable structure to improve a final performance to a limit.

BRIEF SUMMARY OF THE INVENTION

The present invention is directed to a catadioptric projection optical system, an exposure apparatus having the same, and device fabrication method, which shorten the distance (object-to-image distance) between the first object (e.g., a reticle) and the second object (e.g., a wafer) and provides a stable and superior image performance.

A catadioptric projection optical system of one aspect of the present invention for forming plural intermediate images of a first object and for imaging the image of the first object onto a second object, said catadioptric projection optical system includes at least one concave mirror, a first deflective reflector, and a second deflective reflector, wherein a light reflected by the first deflective reflector is directly led to the second deflective reflector.

A catadioptric projection optical system according to another aspect of the present invention forming plural intermediate images of a first object and for imaging the image of the first object onto a second object, said catadioptric projection optical system includes at least one concave mirror, a first deflective reflector, and a second deflective reflector, wherein only optical element having a refractive power of 0 is provided in an optical path between the first deflective reflector and the second deflective reflector.

A catadioptric projection optical system according to another aspect of the present invention as a triple imaging system for forming an intermediate image of a first object twice and for imaging the image of the first object onto a second object, said catadioptric projection optical system includes, in order from the first object, a first lens unit that does not form a reciprocating optical system that an incidence light and reflected light pass, a catadioptric unit that forms the reciprocating optical system, and a second lens unit that does not form the reciprocating optical system, wherein said catadioptric unit includes a third lens unit, and a concave mirror opposing to the first object, wherein said third lens unit includes, in order from the first object, a fourth lens unit having a positive refractive power, and a fifth lens unit having a negative refractive power, wherein said catadioptric projection optical system further includes a first deflective reflector and a second deflective reflector are provided between the concave mirror and the second lens unit.

An exposure apparatus according to still another aspect of the present invention includes an illumination optical system for illuminating a pattern with a light from a light source, and the above catadioptric projection system for projecting the light from the pattern onto an object to be exposed.

A device fabrication method according to another aspect of the present invention includes the steps of exposing an object using the above exposure apparatus and performing a development process for the object exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
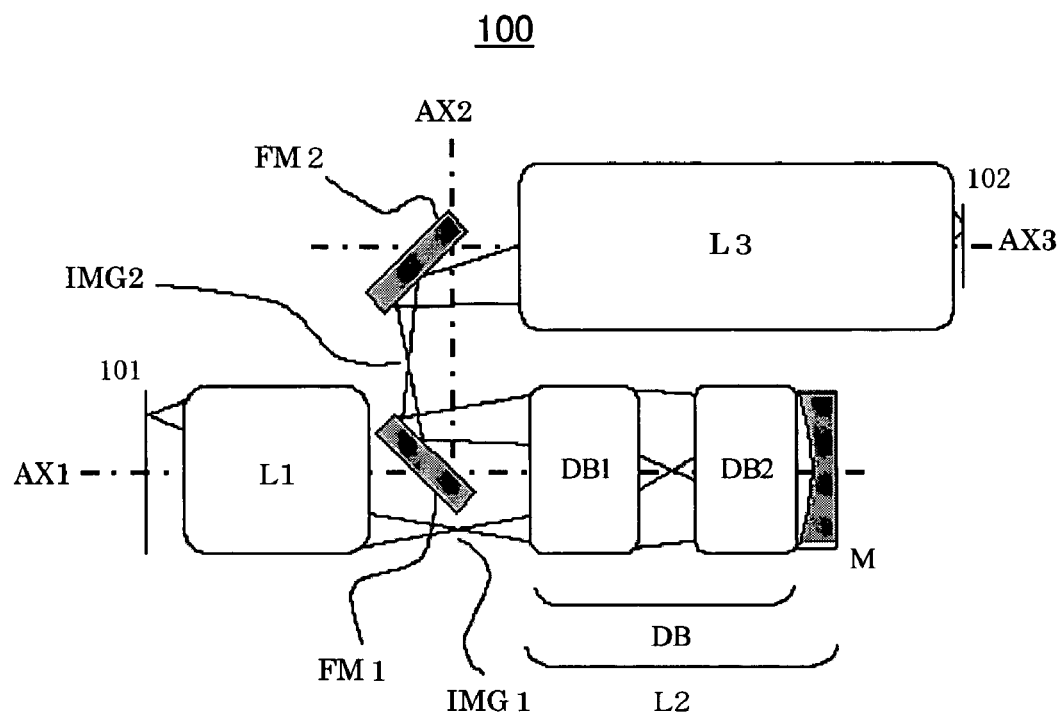
FIG. 1 is a schematic sectional view of a catadioptric projection optical system of one aspect according to the present invention.

With reference to the accompanying drawings, a description will be given of a catadioptric projection optical system according to one aspect of the present invention. In each figure, the same reference numeral denotes the same element. Therefore, a duplicate description will be omitted. Moreover, in this application, "lens unit" includes not only plural lenses but also only one lens. Here, FIG. 1 is a schematic sectional view of a catadioptric projection optical system 100 of the present invention.

Referring to FIG. 1, 101 denotes a first object (e.g., a reticle) and 102 denotes a second object (e.g., a wafer). AX1 to AX3 are optical axes of optical systems. The projection optical system 100 is a triple imaging system for forming an intermediate (or real) image twice. The projection optical system 100 includes, in order from the first object 101 side, a first imaging optical system, a second imaging optical system, and a third imaging optical system.

The first imaging optical system forms a real image of the first object 101 (a first intermediate image IMG1). The light from the first intermediate image IMG1 forms a second intermediate image IMG2 as a real image with the second imaging optical system, which includes a concave mirror M1. The third imaging optical system forms an image of the intermediate image IMG2 as a real image onto the second object 102. The projection optical system 100 can achieve an optical system which images off-axial light without light blockage at the center on a pupil. In instant embodiment, the catadioptic projection optical system 100 is an immersion optical system that fills a space with liquid between the second object 102 and a final lens surface (in other words, the lens surface closest to the second object 102).

The projection optical system 100 includes, in FIG. 1, at least two deflective reflectors (a first deflective reflector FM1 and a second deflective reflector FM2). A light reflected by the first deflective reflector FM1 is directly led to the second deflective reflector FM2. In other words, an optical element having a refractive power does not exist in an optical path between the first deflective reflector FM1 and the second deflective reflector FM2.

The projection optical system 100 includes, in order from the first object 101 side, a lens unit (a first lens unit) L1 having at least one lens that does not form a reciprocating optical system, a dioptric unit L2 having at least one lens that forms the reciprocating optical system, and a lens unit (a second lens unit) L3 having at least one lens that does not form the reciprocating optical system.

The dioptric unit L2 includes a lens unit (a third unit) DB that forms the reciprocating optical system, and the concave mirror M.

The projection optical system 100 includes two deflective reflectors (the first deflective reflector and the second deflective reflector) FM1 and FM2. The first deflective reflector FM1 and the second deflective reflector FM2 are provided in an optical path between the concave mirror M and the lens unit L3. In detail, the first deflective reflector FM1 and the second deflective reflector FM2 are provided in an optical path between the catadioptric unit L2 and the lens unit L3.

The first deflective reflector FM1 bends, as shown in FIG. 1, the optical axis AX1 to the optical axis AX2, and deflects a light from the first object 101. The second deflective reflector FM2 bends the optical axis AX2 to the optical axis AX3.

The first object 101 and the second object 102 are arranged in parallel. The concave mirror M is provided opposes to the first object 101. The optical axis AX2 is orthogonal to a normal of the first object 101 and a normal of the second object 102 each other. However, the optical axis AX2 does not necessarily need to be orthogonal to the optical axis AX1 and the optical axis AX2. If the optical axis AX1 and the optical axis AX2 are parallel, the first object 101 and the second object 102 are arranged in parallel. In other words, the first deflective reflector FM1 and the second deflective reflector FM2 may be provided so that normals of the first deflective reflector FM1 and the second deflective reflector FM2 from an angle of substantially 90°. Moreover, an optical element having a refractive power does not exist in the optical path between the first deflective reflector FM1 and the second deflective reflector FM2.

The lens unit DB that forms the reciprocating optical system includes a lens unit (a fourth lens unit) DB1 having a positive refractive power and a lens unit (a fifth lens unit) DB2 having a negative refractive power, which are preferably provided, in order of the lens unit DB2 and the lens unit DB1 from the concave mirror M. If the lens unit DB2 having a negative refractive power is provided just before the concave mirror M, the refractive power of the concave mirror M can be strengthened, and the lens unit DB2 and the concave mirror M generates large negative Petzval sum. Therefore, a positive Petzval sum generated at other lens units can be effectively cancelled.

The lens unit DB1 having a positive refractive power can reduce a maximum incident angle of the light that is incident upon the first deflective reflector FM1 and the second deflective reflector FM2. The lens unit DB1 having a positive refractive power includes at least one lens having a positive refractive power. The lens unit DB2 includes at least one lens having a negative refractive power.

The lens unit DB preferably includes at one lens having an aspheric surface. Unless the lens having the aspheric surface is used, plural lenses are preferably used for the lens unit DB that forms the reciprocating optical system to share a refractive power. Even if the lens having the aspheric surface is used, it is naturally possible to reduce aberrations generated in a part formed the reciprocating optical system and to effectively correct aberrations generated in other lens units by using plural lenses. The concave mirror M may have an aspheric surface.

The second intermediate image IMG2 preferably is formed between the first deflective reflector FM1 and the second deflective reflector FM2. An effective diameter of lens arranged in two deflective reflectors and near two deflective reflectors can reduce by forming the second intermediate image IMG2 between the first deflective reflector FM1 and the second deflective reflector FM2. Moreover, a distance between the first object 101 and the second object 102 (object-to-image distance) can be shortened effectively.

The first intermediate image IMG1 preferably is formed between the lens unit L1 and the lens unit DB2. The first deflective reflector FM1 and a light from the lens unit L1 to the concave mirror M are easily separable.

Thus, projection optical system 100 adopts the triple imaging system, and includes at lest two deflective reflectors (the first deflective reflector FM1 and the second deflective reflector FM2) and the concave mirror M. The projection optical system 100 can achieve a projection optical system that shortens the image-to-object distance and the effective diameter, and images off-axial light without light blockage at the center on the pupil as the triple imaging system for a higher NA by providing the optical system without having the lens having a refractive power between two deflective reflectors.

In the projection optical system 100 of the present invention, the first imaging optical system includes at least the lens unit L1, the second imaging optical system includes at least the lens unit DB2 having a negative refractive power and the concave mirror M, and the third imaging optical system includes at least the lens unit L3. Moreover, a pupil of the imaging optical system and a pupil of the third imaging optical system respectively exist in the lens unit L1 and the lens unit L3, and these positions on the optical axis is different.

Figure 2:
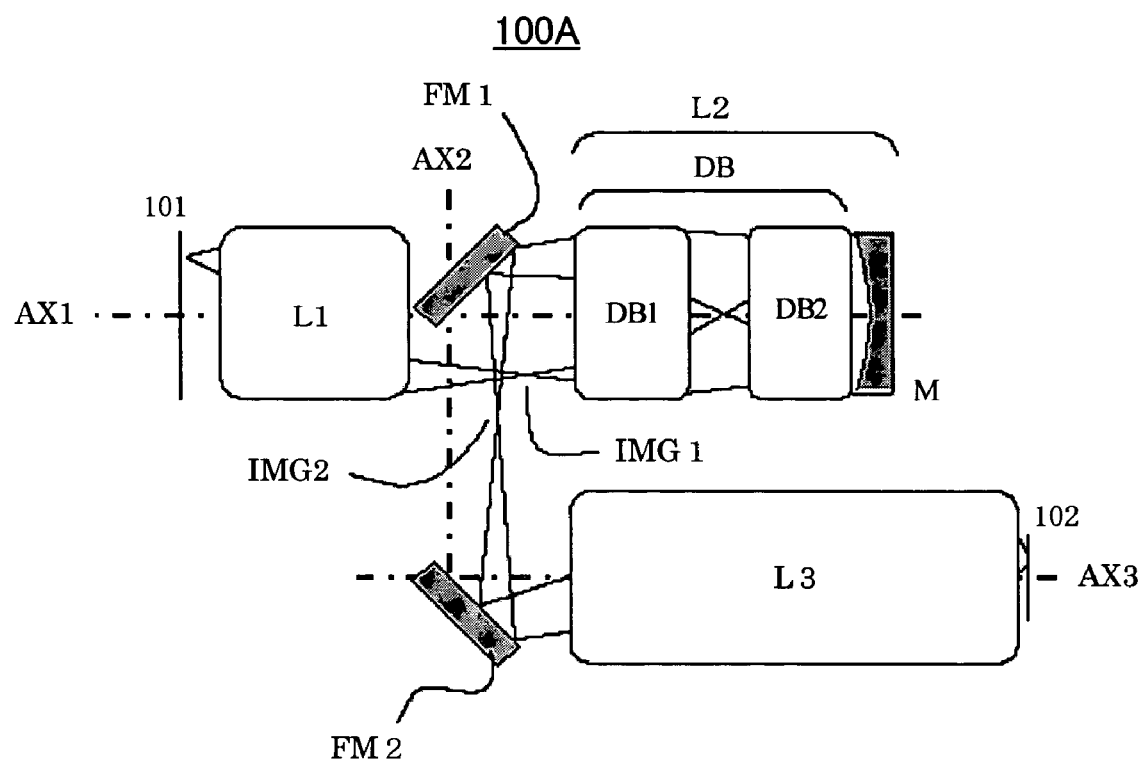
FIG. 2 is a schematic sectional view of another catadioptric projection optical system according to the present invention.
Figure 3:
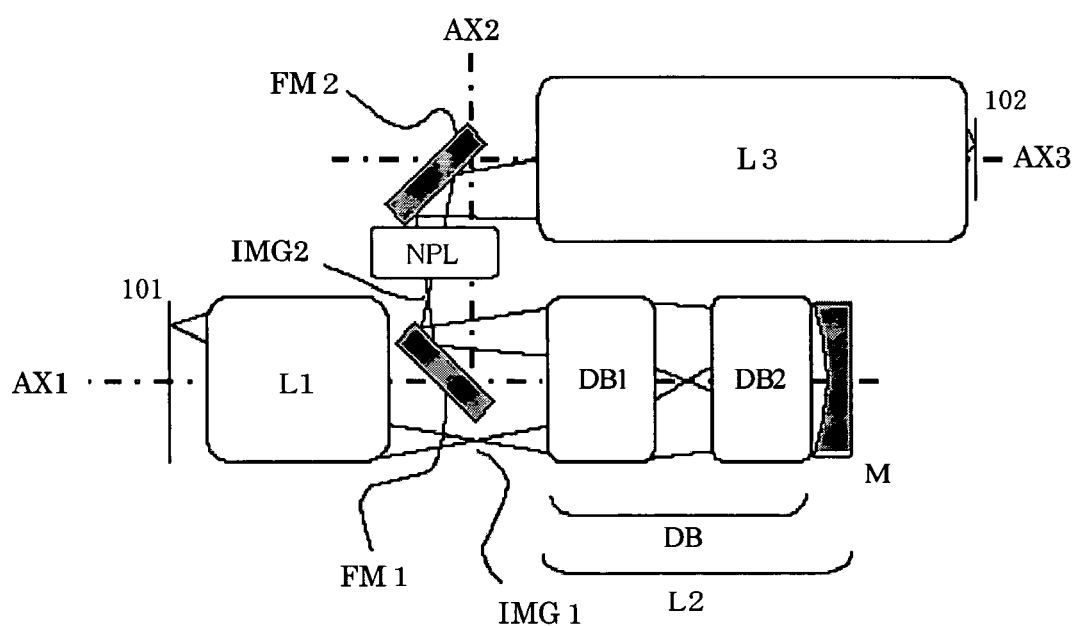
FIG. 3 is a schematic sectional view of another catadioptric projection optical system according to the present invention.
Figure 4:
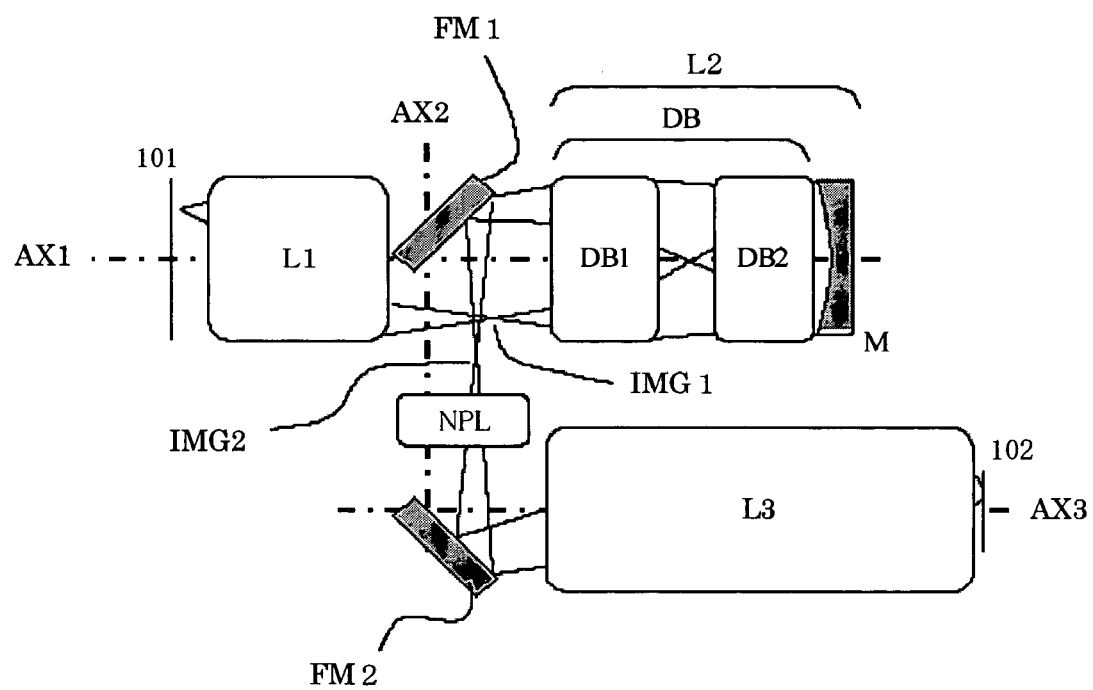
FIG. 4 is a schematic sectional view of another catadioptric projection optical system according to the present invention.

The projection optical system 100 of the present invention is not limited to the structure shown in FIG. 1, and may have structures shown in FIGS. 2 to 4. FIGS. 2 to 4 are views of a projection optical systems 100A to 100C of the present invention.

The projection optical system 100A shown in FIG. 2 is different from the projection optical system 100 shown in FIG. 1 in that the first deflective reflector FM1 is provided so that a light from the lens unit L1 to the concave mirror M intersects a light reflected by the concave mirror M. The projection optical systems 100B and 100C are different from the projection optical systems 100 and 100A in that an optical element NPL having a refractive power of 0 (in other words, does not have a refractive power) exists in an optical path between the first deflective reflector FM1 and the second deflective reflector FM2.

If an optical axis of an optical element having a refractive power is not along a gravity direction, the imaging performance deteriorates by self-weight deformations, eccentricity, and influences of retainer (holding member). The projection optical systems 100 and 100A of the present invention do not include an optical element in the optical path between the first deflective reflector FM1 and the second deflective reflector FM2. In other words, the projection optical systems 100 and 100A do not include an optical element having a refractive power and an optical axis that is not along the gravity direction, and can solve the above problems. In the projection optical systems 100 and 100A, optical axes of all optical elements having a refractive power are along approximately gravity direction.

When an optical element is provided in the optical path between the first deflective reflector FM1 and the second deflective reflector FM2, an optical element that does not have a refractive power may be provided. The optical element that does not have a refractive power is different from the optical element having a refractive power in that the eccentricity accuracy is loose and the influence for the imaging performance is small. The projection optical system 100B shown in FIG. 3 provides the optical element NPL that does not have a refractive power in the optical path between the first deflective reflector FM1 and the second deflective reflector FM2 for the projection optical system 100 shown in FIG. 1. The projection optical system 100C shown in FIG. 4 provides the optical element NPL that does not have a refractive power in the optical path between the first deflective reflector FM1 and the second deflective reflector FM2 for the projection optical system 100A shown in FIG. 2.

The optical element NPL is, for example, a parallel plate. If the optical element NPL is an aspheric, the final imaging performance can improve.

In the projection optical systems 100 and 100A to 100C (hereafter, "the projection optical system 100" includes "the projection optical system 100A to 100C"), the following conditional expressions are met, where $\beta L1$ is a paraxial magnification of the lens unit L1, $\beta$ is a paraxial magnification of the catadioptric projection optical system 100, $\beta L3$ is a paraxial magnification of the lens unit L3, and NA is a numerical aperture at the second object 102 side.

$$4.0 < |\beta L1/\beta| < 24 \quad (1)$$

$$0.05 < |\beta L3 \times NA| < 0.25 \quad (2)$$

The conditional expression (1) defines a ratio between the paraxial imaging magnification $\beta$ of the projection optical system 100 and the paraxial magnification $\beta L1$ of the lens unit L1. If a value is lower than the lower limit in the conditional expression (1), a separation with a light from the first lens unit L1 to the concave mirror M and a light from the concave mirror M to the first deflective reflector FM1 or the deflective reflector FM1 becomes difficult.

On the other hands, if a value is exceeds the upper limit in the condition expression (1), the first intermediate image IMG1 becomes too large, a lens near the first intermediate image IMG1 has an excessively large effective diameter, and other imaging optical systems undesirably have difficulties in magnification control.

The conditional expression (2) defines a product of the paraxial magnification $\beta L3$ of the lens unit L3 and the numerical aperture NA at the second object 102 side. If a value is lower than the lower limit in the conditional expression (2), an extension of the light that is incident upon the first deflective reflector FM1 and the second deflective reflector FM2 becomes too small. In other words, the paraxial magnification $\beta L3$ of the lens unit L3 becomes excessively small, the deflective reflector near the second intermediate image IMG2 and the effective diameter of the lens becomes excessively large, and it becomes difficult to correct aberrations. Moreover, the distance between the second deflective reflector FM2 and the second object 102 becomes large.

On the other hands, if a value is exceeds the upper limit in the condition expression (2), the extension of the light that is incident upon the first deflective reflector FM1 and the second deflective reflector FM2 becomes large, and the film properties of the second deflective reflector FM2 deteriorates. Especially, this becomes remarkable in an optical system that forms the immersion optical system and has a NA of 1 or higher.

More preferably, in the ratio between the paraxial imaging magnification $\beta$ of the projection optical system 100 and the paraxial magnification $\beta L1$ of the lens unit L1 and the product of the paraxial magnification $\beta L3$ of the lens unit L3 and the numerical aperture NA at the second object 102 side, the following conditional expressions are met.

$$6.0 < |\beta L1/\beta| < 20.0 \quad (3)$$

$$0.08 < |\beta L3 \times NA| < 0.23 \quad (4)$$

The conditional expressions (3) and (4) are to properly assign magnification burdens to the lens unit L1 and the lens unit L3, and the film properties of the second deflective reflector FM2 do not deteriorate. Therefore, an optical system with a smaller effective diameter and superior performance can be achieved easily.

Preferably, in the projection optical systems 100 and 100A to 100C, the following conditional expression is met, where NA is a numerical aperture at the second object 102 side.

$$1.0 < NA < 1.8 \quad (5)$$

If a value is lower than the lower limit in the conditional expression (5), obtaining an expected resolving power is difficult when the immersion optical system uses the catadioptric optical system. On the other hands, if a value is exceeds the upper limit in the condition expression (5), the effective diameter of the immersion optical system excessively large, and manufacturing of the lens becomes difficult.

More preferably, in the numerical aperture NA at the second object 102 side of the projection optical system 100 of the present invention, the following conditional expression is met.

$$1.2 < NA < 1.65 \quad (6)$$

Preferably, the following conditional expression is met, where θp is an incident angle of a principal ray that is incident upon the first deflective reflector FM1 or the second deflective reflector FM2.

$$20° < θp < 60° \quad (7)$$

In the conditional expression (7), θp is an angle between a principal ray of a object point from a minimum object point to a maximum object point and a normal of a reflection surface of the first deflective reflector FM1 or the second deflective reflector FM2.

If a value is lower than the lower limit in the conditional expression (7), the imaging performance deteriorates because a refractive power of a nearby lens becomes too strong, and it is difficult to secure a space of nearby deflective reflectors because the nearby lens becomes large.

If a value is exceeds the upper limit in the condition expression (7), an angle of a ray incident upon the deflective reflector FM1 or the deflective reflector FM2 excessively enlarges. Therefore, a design difficulty to maintain superior film properties of the first deflective reflector FM1 or the second deflective reflector FM2 increases. The optical system may be designed so that the value is not exceeds the upper limit in the condition expression (7) to effectively decrease the design difficulty.

More preferably, in the incident angle θp, the following conditional expression is met.

$$35° < θp < 55° \quad (8)$$

A negative Petzval sum generated by the catadioptric unit L2 that forms the reciprocating optical system can cancel out a positive Petzval sum generated by the lens unit L1 that does not form the reciprocating optical system and lens unit L3 that does not form the reciprocating optical system. Preferably, the following conditional expressions are met, where P1 is a Petzval sum of the lens unit L1 that does not form the reciprocating optical system, P2 is a Petzval sum of the catadioptric unit L2 that forms the reciprocating optical system, and P3 is a Petzval sum of the lens unit L3 that does not form the reciprocating optical system. The following conditional expressions enable to achieve an imaging optical system with a small curvature field.

$$P1 > 0, P2 < 0, P3 > 0 \quad (9)$$

$$|P1 + P2 + P3| < 0.1 \quad (10)$$

If the conditional expression (9) is not satisfied, for example, the Petzval sum of the catadioptric unit L2 that forms the reciprocating optical system is zero or positive value, the effects that can excellently correct the Petzval sum by using the concave mirror M and prevent the enlargement of the effective diameter is lost in the catadioptric projection optical system (triple imaging system) 100 compared with an optical system only including lenses.

Moreover, if the Petzval sum of the lens unit L1 and/or the lens unit L3 that do not form the reciprocating optical system is zero or negative value, it becomes difficult to constitute the lens unit L1 and the lens unit L3 only from lenses. If the lens unit L1 and the lens unit L3 consist of only lenses, a lot of strong negative lenses are needed in the lens unit. Therefore, the number of the lens that constitutes the optical system excessively increases, the problem of the exposure aberration becomes serious, and the cost increases.

The concave mirror M is provided in the lens unit L1 or the lens unit L3 so that the Petzval sum of the lens unit L1 and/or the lens unit L3 that do not form the reciprocating optical system becomes zero or negative value. The former causes the light reflected from the concave mirror M to return around the first object 101, and result in physical interference among the first object 101 (e.g., a reticle), returning light, and a nearby lens, thus complicating a mechanical structure. The latter will use the concave mirror M for the final imaging system (or the third imaging optical system), complicating light separation with a high NA.

If the conditional expression (10) is not satisfied, the curvature of field increases, and the imaging performance is considerably deteriorated. However, when the slit shape is an annular shape etc., the conditional expression (11) and the conditional expression (12) may be not satisfied. It is because the imaging performance in a part of the used image point only has to be superior even if the image surface has curved. Moreover, if the slit shape is rectangular shape, similarly, the conditional expression (11) and the conditional expression (12) may be not satisfied for using extremely part of image point.

Preferably, in the projection optical system 100, the following conditional expression is met, where Y is a distance between the optical axes AX1 and AX3, φL2_max is the maximum effective diameter in the catadioptric unit L2, and φL3_max is the maximum effective diameter in the lens unit L3.

$$0.2 < (φL2\_max + φL3\_max)/(2Y) < 0.9 \quad (11)$$

A value below the lower limit of the conditional expression (11) excessively separates the optical axis AX1 and the optical axis AX3 from each other, and excessively enlarges the apparatus. A value exceeding the upper limit of the conditional expression (11) arranges the optical axis AX1 and the optical axis AX3 too closely and causes interference among a lens of the catadioptric unit L2 or a concave mirror M1 and a lens of the lens unit L3, complicating a structure of a lens barrel.

Preferably, the following conditional expression is met, where φM is an effective diameter of the concave mirror M, and hM is a height of the most off-axial principal ray from the optical axis AX1 in the concave mirror M.

$$|hM/φM| < 0.10 \quad (12)$$

If the conditional expression (12) is not satisfied, the concave mirror M separates near the pupil. Thus, it becomes difficult to control astigmatism, etc. that correction is difficult.

The first deflective reflector FM1 and the second deflective reflector FM2 are, for example, a deflective mirror. The deflective mirror shape may be a flat shape or other shape. The first deflective reflector FM1 and the second deflective reflector FM2 may be a mirror using reflections on a rear surface of the glass.

An aperture stop (not shown) may be provided in the lens unit L3. However, the aperture stop may be provided in the lens unit L1 or near the concave mirror M in the lens unit L2. Moreover, plural aperture stops may be provided.

Preferably, in the projection optical system 100, at least the image-surface side is made telecentric to reduce fluctuations of the magnification when a surface of the second object 102 varies in the optical-axis direction. More preferably, the object-surface side is made telecentric.

The projection optical system 100 may include an aberration correction mechanism. For example, it is possible to include a mechanism in the lens unit L1 that moves a lens in an optical axis direction and/or in a direction vertical to an optical axis, or in other directions (to decenter a lens). A similar aberration correction mechanism may be included in the catadioptric unit L2 and the lens unit L3. In addition, a mechanism for deforming the concave mirror M may be included to correct aberrations. Of course, a mechanism for deforming the first deflective reflector FM1 and the second deflective reflector FM2 may be included to correct aberrations.

The projection optical system 100 is an immersion structure that fills a liquid between the second object 102 surface and the final lens surface of the optical system in the instant embodiment. However, the space between the second object 102 surface and the final lens surface may be air. When the space between the second object 102 surface and the final lens surface is air, the numerical aperture NA at the image side is 1 or less.

A field stop may be provided near the first intermediate image IMG1 and the second intermediate image IMG2. Moreover, the field stop may be provided near the second object 102 surface, and a mechanism having the field stop function may be provided the final lens surface. When a diffraction optical element is used for the optical system, and the second object 102 surface and its neighborhood use the above immersion structure, a view-field limiting stop is provided the final lens surface of the optical system or neighborhood. Therefore, the projection optical system 100 can effectively prevent ghost and flare light.

In building an immersion optical system, whether or not a diffraction optical element is present, a interval (an axial interval) between the final lens surface of the optical system and the second object 102 surface is preferably 5 mm or less to minimize influences by liquid properties etc. on the imaging performance of the optical system. However, if the liquid does not influence to the properties of the optical system, it is not limited.

The projection optical system 100 of the present invention is suitable for the exposure apparatus that uses a light with shorten wavelength, preferably a light with a wavelength of 200 nm or less, as exposure light, and is especially effective for the wavelength such as ArF excimer laser and F2 laser that requires for to the immersion. Especially, the magnification of entire system of the projection optical system 100 may use a range of almost $1/10 \leq |\beta| \leq 1/3$.

Hereafter, a description will be given of a configuration of the projection optical system 100.

First Embodiment

Figure 5:
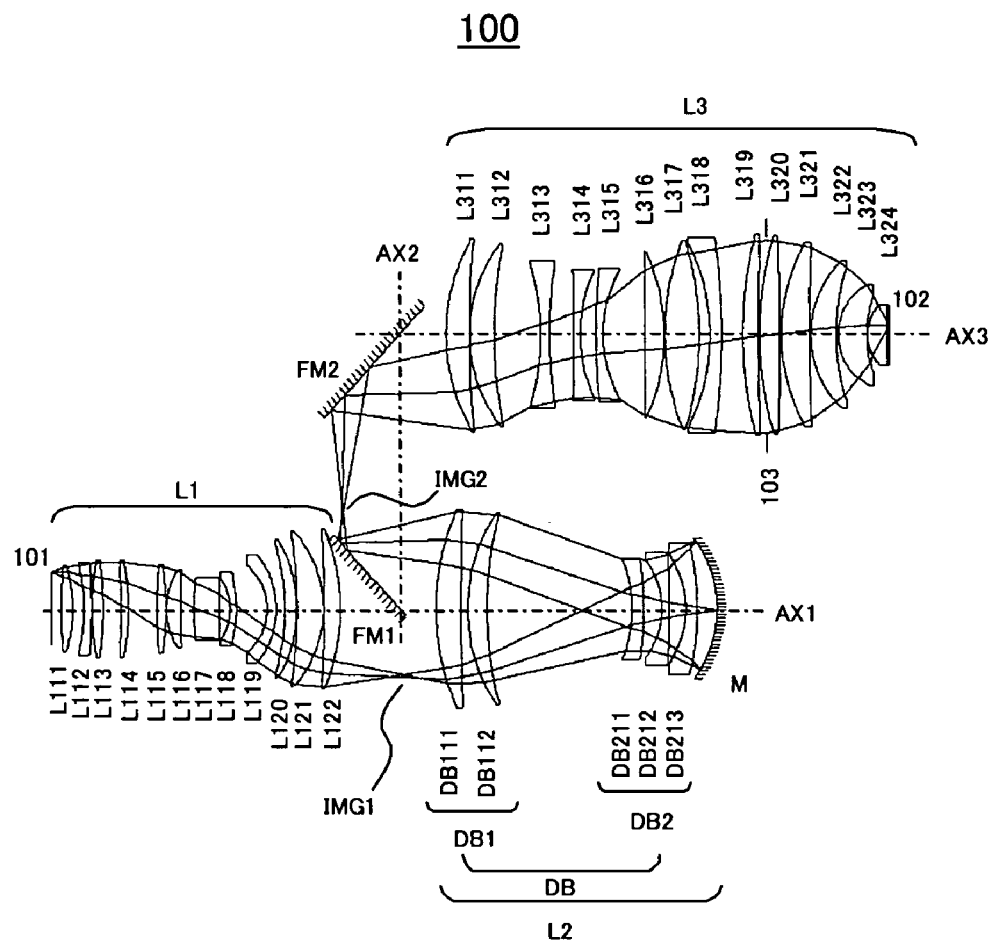
FIG. 5 is an optical-path diagram showing a configuration of the catadioptric projection optical system according to the present invention.

FIG. 5 is an optical-path diagram showing a configuration of the catadioptric projection optical system 100 of the first embodiment. Referring to FIG. 5, the catadioptric projection optical system 100 includes, in order from the first object 101 side, a lens unit (a first lens unit) L1 that does not form a reciprocating optical system, a catadioptric unit L2 that forms the reciprocating optical system, and a lens unit (a second lens unit) L3 that does not form the reciprocating optical system.

The lens unit L1 is a dioptric lens unit that includes at least one lens. The catadioptric unit L2 includes a lens unit (a third lens unit) DB that forms the reciprocating optical system and a concave mirror M. Moreover, the lens unit DB includes a lens unit (a fourth lens unit) DB1 having a positive refractive power and a lens unit (a fifth lens unit) DB2 having a negative refractive power. The lens unit L3 is a dioptric lens unit that includes at least one lens.

The catadioptric projection optical system 100 includes two deflective reflectors (a first deflective reflector and a second deflective reflector) FM1 and FM2. The first deflective reflector FM1 and the second deflective reflector FM2 are arranged between the lens unit L3 and the concave mirror M. Concretely, The first deflective reflector FM1 and the second deflective reflector FM2 are arranged between the lens unit L3 and the catadioptric unit L2. In the instant embodiment, an optical element is not arranged between the first deflective reflector FM1 and the second deflective reflector FM2.

The first deflective reflector FM1 deflects the optical axis AX1 to the optical axis AX2 by 90°. The second deflective reflector FM2 deflects the optical axis AX2 to the optical axis AX3 by 90°. As a result, the light is also reflected. The first deflective reflector FM1 and the second deflective reflector FM2 are a plane mirror in the instant embodiment.

The first intermediate image IMG1 as a real image of the off-axis light exists, in the instant embodiment, between the lens unit L1 that does not form the reciprocating optical system and the lens unit DB1 that forms the reciprocating optical system. The intermediate image IMG2 as the real image exists between the lens unit DB1 that forms the reciprocating optical system and the lens unit L3 that does not form the reciprocating optical system. Concretely, the intermediate image IMG2 exists between the first deflective reflector FM1 and second deflective reflector FM2.

The lens unit L1 that does not form the reciprocating optical system includes, along the light traveling direction from the first object 101 side, a biconvex positive lens L111, a meniscus aspheric negative lens L112 with its concave surface oriented toward the first object 101 side, a biconvex positive lens L113, an approximately planoconvex aspheric positive lens L114 with its approximately plane surface oriented toward the first object 101 side, a biconvex positive lens L115, a meniscus aspheric positive lens L116 with its convex surface oriented toward the first object 101 side, an approximately planoconvex aspheric positive lens L117 with its convex surface oriented toward the first object 101 side, a meniscus aspheric negative lens L118 with its concave surface oriented toward the first object 101 side, a meniscus negative lens L119 with its concave surface oriented toward the first object 101 side, meniscus positive lenses L120 and L121 with theirs concave surfaces oriented toward the first object 101 side, and a meniscus aspheric positive lens L122 with its convex surface oriented toward the concave mirror M.

The lens unit DB1 that forms the reciprocating optical system and has a positive refractive power includes, in order from the first object 101 side, an approximately planoconvex positive lens DB111 with its convex surface oriented toward the first object 101 side and a meniscus positive lens DB 112 with its concave surface oriented toward the concave mirror M.

The lens unit DB2 that forms the reciprocating optical system and has a negative refractive power includes, in order from the first object 101 side, meniscus negative lenses DB211 and DB212 with theirs concave surfaces oriented toward the first object 101 side.

The lens unit L3 that does not the reciprocating optical system includes meniscus positive lenses L311 and L312 with theirs convex surfaces oriented toward the second deflective reflector FM2, a biconcave aspheric negative lens L313, meniscus aspheric negative lenses L314 and L315 with its concave surface oriented toward the second object 102 side, an approximately planoconvex aspheric positive lens L316 with its convex surface oriented toward the second object 102 side, a biconvex positive lens L317, a meniscus negative lens L318 with its concave surface oriented toward the second deflective reflector FM2 side, an approximately planoconvex positive lens L319 with its convex surface oriented toward the second deflective reflector FM2 side, an aperture stop 103, an approximately planoconvex positive lens L320 with its convex surface oriented toward the second deflective reflector FM2 side, an approximately planoconvex aspheric positive lens L321 with its convex surface oriented toward the second deflective reflector FM2 side, a meniscus aspheric positive lens L322 with its concave surface oriented toward the second object 102 side, a meniscus positive lens L323 with its concave surface oriented toward the second object 102 side, a planoconvex positive lens L324 with its plane surface oriented toward the second object 102 side.

The aperture stop 103 is arranged between the positive lens L319 and the positive lens L320 in the instant embodiment but is not limited to this position. For example, the aperture stop 103 is arranged between the aspheric positive lens L316 and the aspheric positive lens L322. Moreover, the aperture stop 103 may be arranged near the concave mirror M in the catadioptric unit L2 that forms the reciprocating optical system and/or near a pupil in the lens unit L1 that does not form the reciprocating optical system.

The catadioptric projection optical system 100 of the first embodiment uses a projection magnification of ¼, a reference wavelength of 193 nm, and quartz and calcium fluoride as a glass material. An image-side numerical aperture is NA=1.27. An object-image distance (the first object 101 surface to the second object 102 surface) is L=1708 mm. An aberration-corrected object point in a range of about 3.5 to 16.5 mm secures a rectangular exposure area of at least 26 mm long and 6.6 mm wide.

FIG. 5 shows a light form one image point of off-axis, actually, the catadioptric projection optical system 100 uses off-axis object point within a range that shifts from the optical axis of the first object 101. In that case, a rectangular slit area that does not include the optical axis or arc-shape slit that does not include the optical axis become the exposure area on the first object and the second object.

Figure 6:
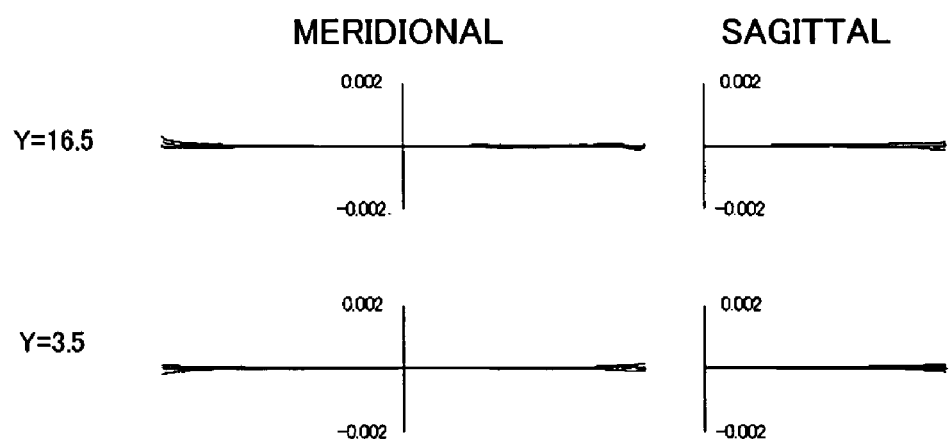
FIG. 6 is an aberrational diagram of the catadioptric projection optical system shown in FIG. 5.

FIG. 6 shows a lateral aberration diagram of the catadioptric projection optical system 100 of the first embodiment. FIG. 6 shows a wavelength with a reference wavelength of 193.0 nm±0.2 µm. Understandably, monochrome and chromatic aberrations are satisfactorily corrected. The used lens material uses only quartz and calcium fluoride in the instant embodiment, and may use other useable lens materials at the same time or singularity.

A liquid supplied between a final lens surface (in other words, the positive lens L324) and the second object 102 is water, and a refractive index is not limited.

Moreover, another liquid may be used if useable as a projection optical system.

The following Table 1 shows the specification of the numerical example of the catadioptric projection optical system 100 of the first embodiment. "i" in the table is a surface number along a direction of light traveling from the first object 101. "ri" is a radius of curvature for each surface corresponding to a surface number. "di" is a surface spacing of each surface. A lens material $SiO_2$ (quartz) and $CaF_2$ (calcium fluoride), and water as liquid (preferably, pure water) has an index to a reference wavelength $\lambda$=193.0 nm are respectively 1.5609, 1.5018 and 1.437, respectively. The refractive indexes of the wavelengths of +0.2 pm and -0.2 pm for the reference wavelength are, 1.56089968 and 1.56090031, respectively for $SiO_2$, 1.50179980 and 1.5018001, respectively for $CaF_2$, 1.43699576 and 1.437000424, respectively for water. A shape of an aspheric surface is given by the following equation:

$$X = (H^2/4)/(1 + ((1-(1+k)\cdot(H/ri)^2))1/2)AH^4 + BH^6 + CH^8 + DH^{10} + EH^{12} + FH^{14} + GH^{16}$$

where X is a displacement in a direction of an optical axis from the lens top, H is a distance from the optical axis, ri is a radius of curvature, k is a conical constant; and A, B, C, D, E, F, and G are aspheric coefficients.

TABLE 1

DISTANCE FROM FIRST OBJECT~FIRST SURFACE: 20.09196 mm

| i | ri | di | LENS MATERIAL |
|---|---|---|---|
| 1 | 818.81597 | 23.14313 | SiO2 |
| 2 | -247.34861 | 23.6483 | |
| 3 | -272.27915 | 15 | SiO2 |
| 4 | -1120.58463 | 1 | |
| 5 | 444.39228 | 22.20115 | SiO2 |
| 6 | -580.35263 | 35.41712 | |
| 7 | -4523.2048 | 15.24964 | SiO2 |
| 8 | -446.14592 | 58.56371 | |
| 9 | 783.53447 | 17.92753 | SiO2 |
| 10 | -474.54238 | 1 | |
| 11 | 117.93848 | 28.88238 | SiO2 |
| 12 | 946.0287 | 26.78585 | |
| 13 | 418.30815 | 52.61328 | SiO2 |
| 14 | -1987.76889 | 21.3176 | |
| 15 | -89.95201 | 12.9 | SiO2 |
| 16 | -146.97057 | 62.63413 | |
| 17 | -94.70819 | 18.80086 | SiO2 |
| 18 | -141.24398 | 17.63229 | |
| 19 | -356.22086 | 24.64803 | SiO2 |
| 20 | -221.61818 | 1 | |
| 21 | -749.31334 | 54.13067 | SiO2 |
| 22 | -190.96409 | 1 | |
| 23 | -2088.24682 | 33.50817 | SiO2 |
| 24 | -312.5227 | 193.17291 | |
| 25 | 392.21036 | 50.84129 | SiO2 |
| 26 | 5064.90001 | 14.22486 | |

TABLE 1-continued

| | | | | |
|---|---|---|---|---|
| 27 | 274.73163 | 41.49067 | SiO2 | |
| 28 | 607.74068 | 293.50954 | | |
| 29 | −217.89713 | 23.52297 | SiO2 | |
| 30 | −576.96924 | 36.71521 | | |
| 31 | −133.39279 | 15.00006 | SiO2 | |
| 32 | −1796.50645 | 33.92345 | | |
| 33 | −139.79119 | 22.70396 | SiO2 | |
| 34 | −455.94044 | 41.6382 | | |
| 35 | −190.16577 | −41.6382 | | M |
| 36 | −455.94044 | −22.70396 | SiO2 | |
| 37 | −139.79119 | −33.92345 | | |
| 38 | −1796.50645 | −15.00006 | SiO2 | |
| 39 | −133.39279 | −36.71521 | | |
| 40 | −576.96924 | −23.52297 | SiO2 | |
| 41 | −217.89713 | −293.50954 | | |
| 42 | 607.74068 | −41.49067 | SiO2 | |
| 43 | 274.73163 | −14.22486 | | |
| 44 | 5064.90001 | −50.84129 | SiO2 | |
| 45 | 392.21036 | −73.17291 | | |
| 46 | 0 | 498.10328 | | FM1 |
| 47 | 0 | −95 | | FM2 |
| 48 | −315.29341 | −48.56566 | SiO2 | |
| 49 | −1433.89893 | −1.00817 | | |
| 50 | −246.12647 | −50.76484 | SiO2 | |
| 51 | −718.58 | −95.43217 | | |
| 52 | 393.83195 | −17.5 | SiO2 | |
| 53 | −748.07119 | −47.03871 | | |
| 54 | −1306.50805 | −15 | SiO2 | |
| 55 | −250.52581 | −31.15835 | | |
| 56 | −985.18445 | −15 | SiO2 | |
| 57 | −217.48984 | −83.77495 | | |
| 58 | −3169.81111 | −39.35369 | SiO2 | |
| 59 | 325.10882 | −1 | | |
| 60 | −424.77235 | −69.59998 | SiO2 | |
| 61 | 541.42553 | −22.21049 | | |
| 62 | 335.52519 | −25 | SiO2 | |
| 63 | 1085.60933 | −42.69733 | | |
| 64 | −645.77026 | −31.91298 | SiO2 | |
| 65 | −4199.06678 | −18 | | |
| 66 | 0 | 15.28974 | | APERTURE STOP |
| 67 | −584.26074 | −40.70085 | SiO2 | |
| 68 | 3400.43228 | −2.66518 | | |
| 69 | −296.00597 | −58.98251 | SiO2 | |
| 70 | −3249.63702 | −2.99788 | | |
| 71 | −174.75047 | −50.87952 | SiO2 | |
| 72 | −417.06623 | −3.65293 | | |
| 73 | −96.87693 | −57.96772 | CaF2 | |
| 74 | −185.9659 | −1 | | |
| 75 | −71.13104 | −42.03329 | CaF2 | |
| 76 | 0 | −2.87554 | water | |

| aspherical surfaces | | | | |
|---|---|---|---|---|
| i | K | A | B | C |
| 4 | 1.116845E+02 | −1.464007E−08 | −5.079905E−14 | 1.071068E−16 |
| 12 | −2.200835E+02 | −1.877905E−07 | 3.749957E−11 | −3.082301E−15 |
| 13 | 3.764983E+01 | −5.487135E−08 | −2.941492E−11 | −2.571998E−15 |
| 16 | −1.609740E+00 | 2.270452E−07 | 2.221228E−11 | −7.293151E−16 |
| 24 | 1.954195E−01 | 7.942173E−09 | 5.259436E−14 | 9.441228E−19 |
| 33 | −4.311613E−01 | 2.002386E−08 | 1.596568E−12 | 6.950046E−17 |
| 37 | −4.311613E−01 | 2.002386E−08 | 1.596568E−12 | 6.950046E−17 |
| 52 | 1.109886E+00 | 1.351470E−08 | −1.619739E−12 | 1.593760E−17 |
| 54 | −8.400355E+01 | 1.993784E−08 | 1.054270E−12 | −2.169139E−18 |
| 57 | 1.021183E−01 | −1.426818E−09 | 4.250505E−15 | 7.468542E−17 |
| 58 | −7.648330E+02 | 7.649542E−09 | −2.849803E−13 | 1.070341E−17 |
| 69 | −8.585218E−02 | 4.121077E−10 | 9.553498E−14 | −1.733521E−18 |
| 72 | 2.027403E+00 | −7.934585E−09 | −1.713488E−13 | −5.379751E−18 |

| i | D | E | F | G |
|---|---|---|---|---|
| 4 | −1.247725E−20 | 3.198802E−24 | −3.562827E−28 | 1.779710E−32 |
| 12 | 6.764231E−19 | −9.250050E−23 | 2.167456E−26 | −2.202085E−30 |
| 13 | 1.517741E−18 | −8.342200E−22 | 2.189957E−25 | −1.969149E−29 |
| 16 | −2.422641E−19 | −2.463494E−23 | 1.207492E−26 | −8.546394E−31 |
| 24 | −2.821889E−23 | 2.387643E−27 | −8.674998E−32 | 1.500142E−36 |
| 33 | 1.780881E−21 | −3.804714E−26 | 1.518435E−30 | −5.589433E−34 |
| 37 | 1.780881E−21 | −3.804714E−26 | 1.518435E−30 | −5.589433E−34 |
| 52 | 2.572528E−21 | −1.509903E−25 | 3.700194E−30 | −3.426751E−35 |

TABLE 1-continued

| | | | |
|---|---|---|---|
| 54 | −2.919614E−21 | −2.075946E−26 | 6.540806E−30 | −1.785118E−34 |
| 57 | −1.634164E−21 | −8.141978E−26 | 7.814875E−30 | −2.461966E−34 |
| 58 | −8.969455E−23 | 2.202690E−27 | −2.978392E−32 | 8.343543E−37 |
| 69 | 2.512153E−23 | 1.768577E−28 | −4.603931E−33 | 1.597585E−38 |
| 72 | 4.454515E−22 | −3.967453E−26 | 1.641687E−30 | −3.642490E−35 |

L = 1707.58 mm
β = ¼
NA = 1.27
P1 = 0.0081617
P2 = −0.017998
P3 = 0.0098372
|P1 + P2 + P3| = 9e−7
(φL2_max + φL3_max)/(2 * Y) = 0.712
θp = 43.2~46.8
|βL1/β| = 7.12
|βL3 * NA| = 0.193
|hM/φM| = 0.012

Second Embodiment

Figure 7:
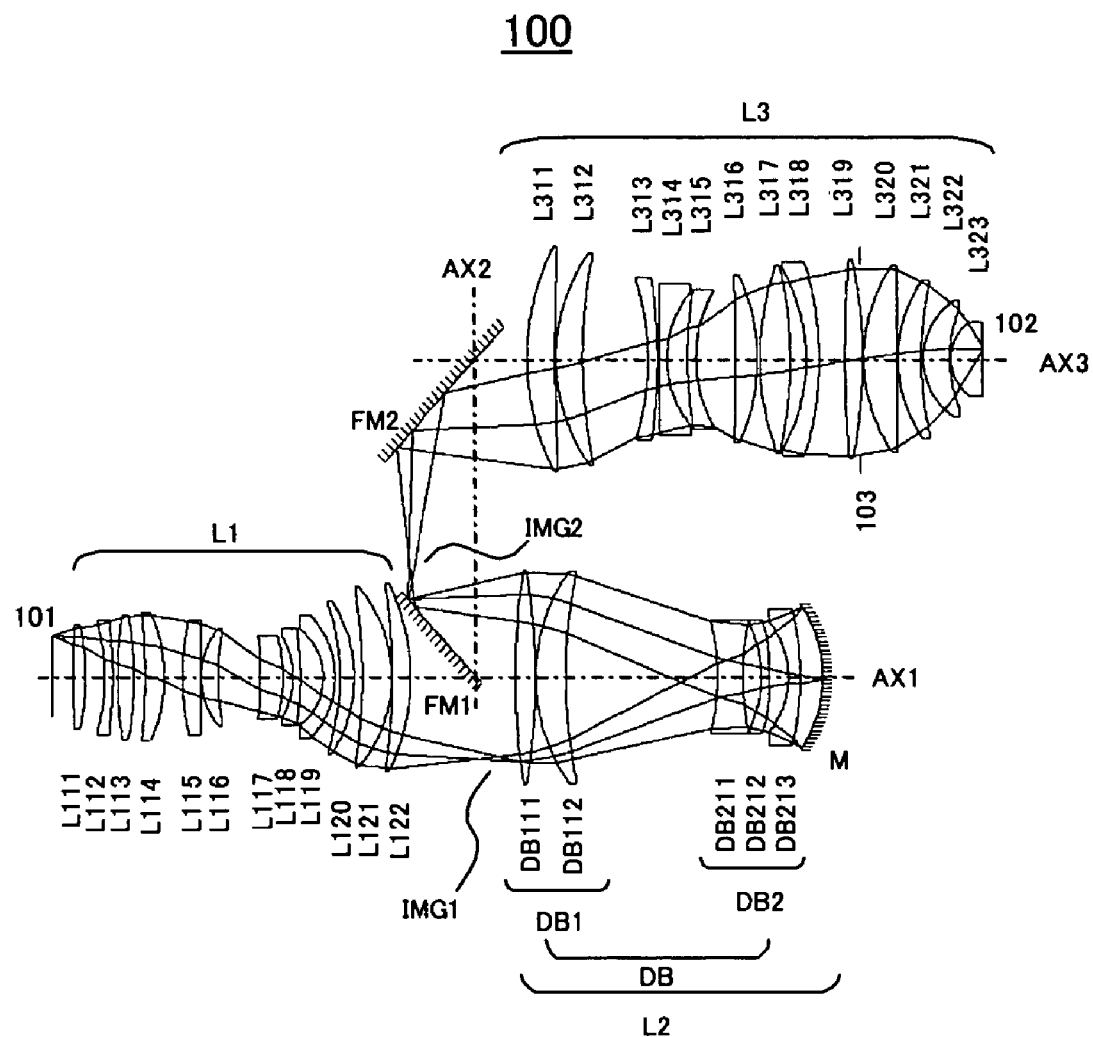
FIG. 7 is an optical-path diagram showing a configuration of the catadioptric projection optical system according to the present invention.

FIG. 7 is an optical-path diagram showing a configuration of the catadioptric projection optical system 100 of the second embodiment. Referring to FIG. 7, the catadioptric projection optical system 100 includes, in order from the first object 101 side, a lens unit (a first lens unit) L1 that does not form a reciprocating optical system, a catadioptric unit L2 that forms the reciprocating optical system, and a lens unit (a second lens unit) L3 that does not form the reciprocating optical system.

The lens unit L1 is a dioptric lens unit that includes at least one lens. The catadioptric unit L2 includes a lens unit (a third lens unit) DB that forms the reciprocating optical system and a concave mirror M. Moreover, the lens unit DB includes a lens unit (a fourth lens unit) DB1 having a positive refractive power and a lens unit (a fifth lens unit) DB2 having a negative refractive power. The lens unit L3 is a dioptric lens unit that includes at least one lens.

The first deflective reflector FM1 and the second deflective reflector FM2 are arranged between the lens unit L3 and the catadioptric unit L2. In the instant embodiment, an optical element is not arranged between the first deflective reflector FM1 and the second deflective reflector FM2.

The first deflective reflector FM1 deflects the optical axis AX1 to the optical axis AX2 by 90°. The second deflective reflector FM2 deflects the optical axis AX2 to the optical axis AX3 by 90°. As a result, the light is also reflected. The first deflective reflector FM1 and the second deflective reflector FM2 are a plane mirror in the instant embodiment.

The first intermediate image IMG1 as a real image of the off-axis light exists, in the instant embodiment, between the lens unit L1 that does not form the reciprocating optical system and the lens unit DB1 that forms the reciprocating optical system. The second intermediate image IMG2 as the real image exists between the lens unit DB1 that forms the reciprocating optical system and the lens unit L3 that does not form the reciprocating optical system. Concretely, the second intermediate image IMG2 exists between the first deflective reflector FM1 and second deflective reflector FM2. The first intermediate image IMG1 exists between the lens unit L1 and the concave mirror M. However, the first intermediate image IMG1 may exist in the lens unit DB1 having a positive refractive power that forms the reciprocating optical system, and between the lens unit DB1 having a positive refractive power that forms the reciprocating optical system and the lens unit DB2 having a negative refractive power.

The lens unit L1 that does not form the reciprocating optical system includes, along the light traveling direction from the first object 101 side, a biconvex positive lens L111, a meniscus aspheric negative lens L112 with its concave surface oriented toward the first object 101 side, a biconvex positive lens L113, a meniscus positive lens L114 with its convex surface oriented toward the first object 101 side, an approximately planoconvex positive lens L115 with its convex surface oriented toward the first object 101 side, a meniscus aspheric positive lens L116 with its convex surface oriented toward the first object 101 side, an approximately planoconvex aspheric positive lens L117 with its convex surface oriented toward the first object 101 side, a meniscus aspheric negative lens L118 with its concave surface oriented toward the first object 101 side, a meniscus negative lens L119 with its concave surface oriented toward the first object 101 side, meniscus positive lenses L120 and L121 with theirs concave surfaces oriented toward the first object 101 side, and a meniscus aspheric positive lens L122 with its convex surface oriented toward the concave mirror M side.

The lens unit DB1 that forms the reciprocating optical system and has a positive refractive power includes, in order from the first object 101 side, a biconvex positive lens DB111 and a meniscus positive lens DB 112 with its concave surface oriented toward the concave mirror M side.

The lens unit DB2 that forms the reciprocating optical system and has a negative refractive power includes, in order from the first object 101 side, a meniscus negative lens DB211 with its concave surface oriented toward the first object 101 side and a meniscus aspheric negative lens DB212 with its concave surface oriented toward the first object 101 side.

The lens unit L3 that does not the reciprocating optical system includes a meniscus positive lens L311 with its convex surface oriented toward the second deflective reflector FM2, a meniscus aspheric positive lens L312 with its convex surface oriented toward the second deflective reflector FM2, a meniscus aspheric negative lens L313 with its concave surface oriented toward the second deflective reflector FM2, an approximately planoconcave negative lens L314 with its concave surface oriented toward the second deflective reflector FM2, a meniscus aspheric negative lens L315 with its concave surface oriented toward the second object 102 side, an approximately planoconvex aspheric positive lens L316 with its convex surface oriented toward the second object 102 side, a biconvex positive lens L317, a meniscus negative lens L318 with its concave surface oriented toward the second deflective reflector FM2 side, an approximately planoconvex positive lens L319 with its convex surface oriented toward the second object 102 side, an aperture stop 103, an approximately planoconvex positive lens L320 with its convex surface oriented toward the second deflective reflector FM2 side, meniscus aspheric positive lenses L321 and L322 with theirs convex surfaces oriented toward the second deflective reflector FM2 side, and a planoconvex positive lens L323 with its plane surface oriented toward the second object 102 side.

The aperture stop 103 is arranged between the positive lens L319 and the positive lens L320 in the instant embodiment but is not limited to this position.

The catadioptric projection optical system 100 of the first embodiment uses a projection magnification of ¼, a reference wavelength of 193 nm, and quartz and calcium fluoride as a glass material. An image-side numerical aperture is NA=1.27. An object-image distance (the first object 101 surface to the second object 102 surface) is L=1688 mm. An aberration-corrected object point in a range of about 3.5 to 16.25 mm secures a rectangular exposure area of at least 26 mm long and 6.2 mm wide. The exposure area is not limited to a rectangle and may use an arc shape or another shape.

Figure 8:
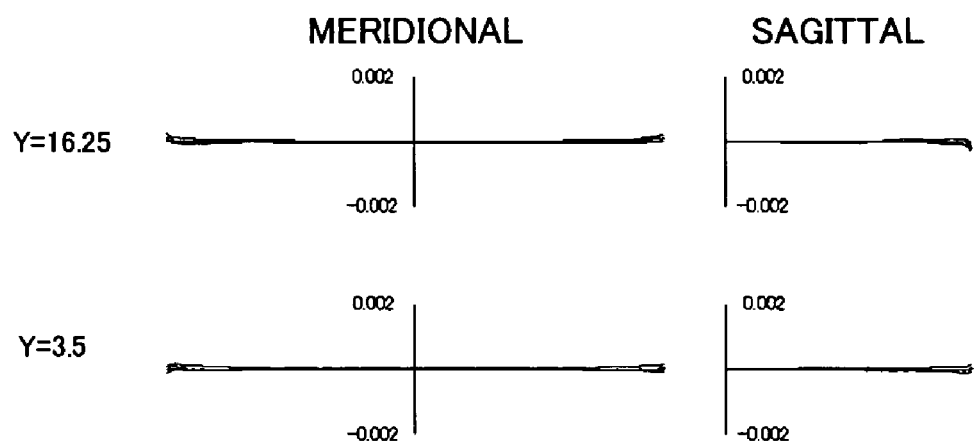
FIG. 8 is an aberrational diagram of the catadioptric projection optical system shown in FIG. 7.

FIG. 8 shows a lateral aberration diagram of the catadioptric projection optical system 100 of the second embodiment. FIG. 8 shows a wavelength with a reference wavelength of 193.0 nm±0.2 pm. Understandably, monochrome and chromatic aberrations are satisfactorily corrected.

A liquid supplied between a final lens surface (in other words, the positive lens L323) and the second object 102 is water, and a refractive index is not limited. Moreover, another liquid may be used if useable as a projection optical system.

The following Table 2 shows the specification of the numerical example of the catadioptric projection optical system 100 of the second embodiment. Symbols in the table are the same as in table 1, and thus a description thereof will be omitted.

TABLE 2

| DISTANCE FROM FIRST OBJECT~FIRST SURFACE: 36.83711 mm | | | |
|---|---|---|---|
| i | ri | di | LENS MATERIAL |
| 1 | 983.25272 | 24.09514 | SiO2 |
| 2 | −331.72023 | 35.40756 | |
| 3 | −257.69109 | 15.00031 | SiO2 |
| 4 | −432.29206 | 8.01203 | |
| 5 | 559.30138 | 30.4618 | SiO2 |
| 6 | −494.56014 | 20.01922 | |
| 7 | −973.87496 | 34.61535 | SiO2 |
| 8 | −223.56876 | 32.06524 | |
| 9 | 379.89127 | 33.14299 | SiO2 |
| 10 | 3495.70248 | 1 | |
| 11 | 111.32793 | 29.99645 | SiO2 |
| 12 | 316.88953 | 76.22508 | |
| 13 | 930999.9644 | 40.65989 | SiO2 |
| 14 | −229.63171 | 17.96433 | |
| 15 | −118.65909 | 13.08073 | SiO2 |
| 16 | −312.30792 | 41.67593 | |
| 17 | −89.66234 | 20.82683 | SiO2 |
| 18 | −131.61158 | 9.36807 | |
| 19 | −319.19571 | 25.89459 | SiO2 |
| 20 | −202.63211 | 14.67571 | |
| 21 | −764.72536 | 52.82477 | SiO2 |
| 22 | −203.90909 | 1 | |
| 23 | −928.12586 | 33.19451 | SiO2 |
| 24 | −284.17001 | 189.72235 | |
| 25 | 822.97621 | 38.67465 | SiO2 |
| 26 | −887.46613 | 1 | |
| 27 | 266.75649 | 53.97937 | SiO2 |
| 28 | 679.71465 | 272.96979 | |
| 29 | −326.85172 | 45.585 | SiO2 |
| 30 | 337.73643 | 34.48079 | |
| 31 | −173.75762 | 15 | SiO2 |
| 32 | −441.82178 | 33.70541 | |
| 33 | −130.86445 | 21.36027 | SiO2 |
| 34 | −434.27424 | 40.16432 | |
| 35 | −191.23493 | −40.16432 | M |
| 36 | −434.27424 | −21.36027 | SiO2 |
| 37 | −130.86445 | −33.70541 | |
| 38 | −441.82178 | −15 | SiO2 |
| 39 | −173.75762 | −34.48079 | |
| 40 | 337.73643 | −45.585 | SiO2 |
| 41 | −326.85172 | −272.96979 | |
| 42 | 679.71465 | −53.97937 | SiO2 |
| 43 | 266.75649 | −1 | |
| 44 | −887.46613 | −38.67465 | SiO2 |
| 45 | 822.97621 | −69.72235 | |
| 46 | 0 | 510.33328 | FM1 |
| 47 | 0 | −95 | FM2 |

TABLE 2-continued

| | | | |
|---|---|---|---|
| 48 | −355.9221 | −51.20976 | SiO2 |
| 49 | −3728.90796 | −1.59168 | |
| 50 | −268.48681 | −48.59239 | SiO2 |
| 51 | −755.59051 | −117.99199 | |
| 52 | 389.13976 | −17.5 | SiO2 |
| 53 | 776.89376 | −2.59121 | |
| 54 | −6645.32789 | −15.19068 | SiO2 |
| 55 | −158.96591 | −35.64321 | |
| 56 | −648.36236 | −15 | SiO2 |
| 57 | −212.7476 | −70.40306 | |
| 58 | 19003.87684 | −39.90384 | SiO2 |
| 59 | 290.06641 | −4.46971 | |
| 60 | −393.31309 | −55.46912 | SiO2 |
| 61 | 595.55957 | −28.42222 | |
| 62 | 267.29442 | −22.87413 | SiO2 |
| 63 | 480.71797 | −46.97546 | |
| 64 | −1864.22158 | −32.63616 | SiO2 |
| 65 | 679.88485 | 4.97111 | |
| 66 | 0 | −7.18334 | APERTURE STOP |
| 67 | −248.28002 | −59.4655 | SiO2 |
| 68 | 18559.08635 | −2.17274 | |
| 69 | −199.90595 | −42.28962 | SiO2 |
| 70 | −501.45646 | −3.84108 | |
| 71 | −105.2322 | −47.64509 | SiO2 |
| 72 | −188.00198 | −2.01685 | |
| 73 | −68.17785 | −56.80623 | SiO2 |
| 74 | 0 | −2.47259 | water |

| aspherical surfaces | | | |
|---|---|---|---|
| i | K | A | B | C |
| 4 | −9.761049E+00 | 3.184827E−08 | 3.139257E−13 | 3.734881E−17 |
| 12 | 8.234382E+00 | −1.283386E−07 | 2.681804E−11 | −3.052084E−15 |
| 13 | −6.888302E+09 | −1.691052E−07 | −8.604362E−12 | −2.589195E−15 |
| 16 | 6.692937E−01 | 1.547761E−07 | −1.375236E−11 | 1.138495E−16 |
| 24 | 4.523053E−02 | 7.524906E−09 | 5.672192E−14 | 9.899510E−19 |
| 32 | 1.365205E+01 | −4.439820E−08 | 1.250582E−12 | −1.605082E−16 |
| 38 | 1.365205E+01 | −4.439820E−08 | 1.250582E−12 | −1.605082E−16 |
| 50 | −1.359327E−01 | −3.781526E−10 | −4.290748E−16 | −4.836543E−20 |
| 52 | 7.883747E−01 | 1.379962E−08 | −1.633607E−12 | 4.169943E−17 |
| 57 | 2.358724E−01 | −5.854009E−09 | 3.417272E−13 | 1.226408E−17 |
| 58 | 1.719737E+04 | 1.004903E−08 | −2.135921E−13 | 4.277745E−18 |
| 69 | −1.254391E−02 | −1.475901E−09 | 4.106118E−13 | −5.158051E−18 |
| 71 | −6.072257E−02 | −1.254805E−08 | 9.176790E−14 | 6.858823E−17 |

| i | D | E | F | G |
|---|---|---|---|---|
| 4 | −4.467629E−21 | 9.127853E−25 | −1.055576E−28 | 4.106171E−33 |
| 12 | 2.642857E−19 | −2.189217E−23 | 1.763066E−27 | −9.875592E−32 |
| 13 | 8.457425E−19 | −2.320560E−22 | 3.160569E−26 | −4.387570E−30 |
| 16 | 1.154370E−19 | −9.899640E−24 | 3.560051E−29 | 2.086427E−32 |
| 24 | −3.161667E−23 | 2.247914E−27 | −7.882796E−32 | 1.168270E−36 |
| 32 | 6.897942E−21 | −1.344401E−25 | −2.126231E−29 | 2.631718E−33 |
| 38 | 6.897942E−21 | −1.344401E−25 | −2.126231E−29 | 2.631718E−33 |
| 50 | −7.144176E−24 | 3.891220E−28 | −2.132129E−32 | 3.894286E−37 |
| 52 | 1.271973E−21 | −1.422992E−25 | 4.583328E−30 | −5.527480E−35 |
| 57 | 2.737426E−21 | −3.557467E−26 | −5.154403E−30 | 1.627519E−34 |
| 58 | 1.080503E−22 | 5.310358E−27 | −2.530184E−32 | 1.960246E−36 |
| 69 | 1.008831E−21 | −5.336623E−27 | 4.022563E−31 | −5.393224E−36 |
| 71 | 1.071563E−21 | −1.127298E−26 | 3.222829E−29 | −1.834670E−33 |

L = 1688.43 mm
$\beta$ = ¼
NA = 1.27
P1 = 0.0076573
P2 = −0.0178112
P3 = 0.010157
|P1 + P2 + P3| = 3.1e−6
($\phi$L2_max + $\phi$L3_max)/(2 * Y) = 0.676
$\theta$p = 42.7~47.3
|$\beta$L1/$\beta$| = 7.72
|$\beta$L3 * NA| = 0.167
|hM/$\phi$M| = 0.018

The catadioptic projection optical system of the present invention can arrange the first object (reticle) and the second object (wafer) in parallel, and shorten the object-to-image distance without enlarging the optical system for a higher NA by the immersion. The optical axes of all optical elements having a refractive power are arranged along the approximately direction, and catadioptic projection optical system of the present invention provides the stable and superior image performance.

Figure 9:
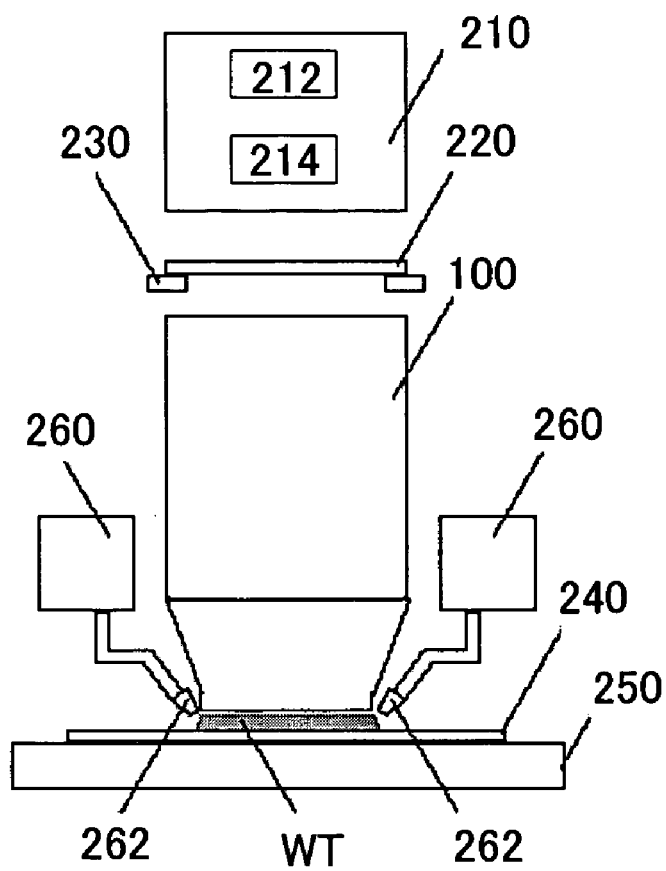
FIG. 9 is a schematic sectional view of an exposure apparatus of one aspect according to the present invention.

Referring now to FIG. 9, a description will be given of an exposure apparatus 200 to which the catadioptric projection optical system 100 of the present invention is applied. FIG. 9 is a schematic sectional view of the exposure apparatus 200 of one aspect according to the present invention.

The exposure apparatus 200 is an immersion type exposure apparatus that exposes onto an object 240 a circuit pattern created on a reticle 220 via a liquid WT supplied between a final lens surface at the object 240 side of a projection optical system 100 and the object 240 in a step-and-scan manner or step-and-repeat manner. Such an exposure apparatus is suitable for a sub-micron or quarter-micron lithography process. The instant embodiment exemplarily describes a step-and-scan exposure apparatus (which is also called "scanner"). "The step-and-scan manner", as is used herein, is an exposure method that exposes a reticle pattern onto a wafer by continuously scanning the wafer relative to the reticle, and by moving, after a shot of exposure, the wafer stepwise to the next exposure area to be shot. "The step-and-repeat manner" is another mode of exposure method that moves a wafer stepwise to an exposure area for the next shot every short of cell projection.

The exposure apparatus 200 includes, as shown in FIG. 9, an illumination apparatus 210, a reticle stage 230 that mounts the reticle 20, the catadioptric projection optical system 100, a wafer stage 250 that mounts the object 240, a liquid supply-recovery mechanism 260, and a controller (not shown). The controller (not shown) can control and connects with the illumination apparatus 210, the reticle stage 230, the wafer stage 250, and the liquid supply-recovery mechanism 260.

The illumination apparatus 210 illuminates the reticle 220 that forms a circuit pattern to be transferred. The illumination apparatus 210 includes a light source unit 212 and an illumination optical system 214.

The light source unit 212 uses, as an example, a light source such as ArF excimer laser with a wavelength of approximately 193 [nm] and KrF excimer laser with a wavelength of approximately 248 [nm]. However, the laser type is not limited to excimer lasers because, for example, $F_2$ laser with a wavelength of approximately 157 [nm] may be used. Similarly, the number of laser units is not limited. For example, two independently acting solid lasers would cause no coherence between these solid lasers and significantly reduce speckles resulting from the coherence. An optical system for reducing speckles may swing linearly or rotationally. A light source applicable to the light source unit 212 is not limited to a laser. One or more lamps, such as a mercury lamp and a xenon lamp, may be used.

The illumination optical system 214 is an optical system that illuminates the reticle 220. The illumination optical system 214 includes a lens, a mirror, an optical integrator, a stop, and the like. For example, a condenser lens, an optical integrator, an aperture stop, a condenser lens, a slit, and an imaging optical system are arranged in this order. The illumination optical system 214 can use any light regardless of whether it is on-axial or off-axial light. The optical integrator may include a fly-eye lens or an integrator formed by stacking two sets of cylindrical lens array plates (or lenticular lenses), and be replaced with an optical rod or a diffractive element.

The reticle 220 is, for example, reflection or penetration reticle, and forms the circuit pattern to be transferred. The reticle 220 is supported and driven by the reticle stage 230. Diffracted light emitted from the reticle 220 passes the catadioptric projection optical system 230. Then it is projected onto the object 240. The reticle 220 and the object 240 are located in an optically conjugate relationship. Since the exposure apparatus 200 of the instant embodiment is a scanner, the reticle 220 and the object 240 are scanned at the speed of the reduction ratio. Thus, the pattern on the reticle 220 is transferred to the object 240. If it is a step-and-repeat exposure apparatus (referred to as a "stepper"), the reticle 220 and the object 240 remain still in exposing the reticle pattern.

The reticle stage 230 supports the reticle 220 via a reticle chuck (not shown), and is connected to a moving mechanism (not shown). The moving mechanism includes a linear motor, etc., and moves the reticle 220 by driving the reticle stage 230 at least in a direction X. The exposure apparatus 200 scans the reticle 220 and the object 240 synchronously by the controller (not shown). Here, X is a scan direction on the reticle 220 or the object 240, Y is a direction perpendicular to it, and Z is a perpendicular direction to the surface of reticle 220 or the object 240.

The catadioptric projection optical system 100 is a catadioptric projection optical system that projects the pattern on the reticle 220 onto the image surface. The catadioptric projection optical system 100 can apply any embodiments as above-mentioned, and a detailed description will be omitted.

The object 240 is, in the instant embodiment, a wafer, which includes a glass plate for the liquid crystal substrate and other objects. Photoresist is applied to the object 240.

The wafer stage 250 supports the object 240 via a wafer chuck (not shown). The wafer stage 250 moves the object 250 in X-Y-Z directions by using a linear motor similar to the reticle stage 230. The positions of the reticle stage 230 and wafer stage 250 are monitored, for example, by a laser interferometer and the like, so that both are driven at a constant speed ratio. The wafer stage 250 is installed on a stage stool supported on the floor and the like, for example, via a dumper, and the reticle stage 230 and the catadioptric projection optical system 100 are installed on a lens barrel stool (not shown) supported, for example, via a dumper to the base frame placed on the floor.

The liquid supply-recovery mechanism 260 supplies the liquid WT between the catadioptric projection optical system 100 and the object 240, which in detail means between the final lens surface at the object 240 side of the catadioptric projection optical system 100 (optical element arranged on the object 240 side final edge of the catadioptric projection optical system 100) and recovers the supplied liquid WT. In other words, the space formed on the catadioptric projection optical system 100 and the surface of the object 240 is filled with the liquid WT supplied from the liquid supply-recovery mechanism 260. The liquid WT is, in the instant embodiment, pure water. However, the liquid WT is not limited to pure water, can use a liquid that has high transmittance property and refractive index property for a wavelength of the exposure light, and high chemical stability to the catadioptric projection optical system 100 and the photoresist spread on the object 240. For example, fluorine system inert liquid may be used.

The controller (not shown) includes a CPU and memory (not shown) and controls operation of the exposure apparatus 200. The controller is electrically connected to the illumination apparatus 210, (the moving mechanism (not shown) for) the reticle stage 230, (the moving mechanism (not shown) for) the wafer stage 250, and the liquid supply-recovery mechanism 260. The controller controls the supply and recover of the liquid WT, switch of stop, and supply and recover amount of the liquid WT based on a condition such as a drive direction of the wafer stage 250 during the exposure. The CPU includes a processor regardless of its name, such as an MPU, and controls each module. The memory includes a ROM and RAM, and stores a firmware for controlling the operations of the exposure apparatus 200.

In exposure, light is emitted from the light source unit 212, e.g., Koehler-illuminated the reticle 220 via the illumination optical system 214. Light that passes through the reticle 220 and reflects the reticle pattern is imaged onto the object 240 by the catadioptric projection optical system 100. The catadioptric projection optical system 100 used for the exposure apparatus 200 has a superior imaging performance, and can provide devices, such as semiconductor chips, such as LSIs and VLSIs, CCDs, LCDs, magnetic sensors, and thin-film magnetic heads, with high throughput and economic efficiency.

Figure 10:
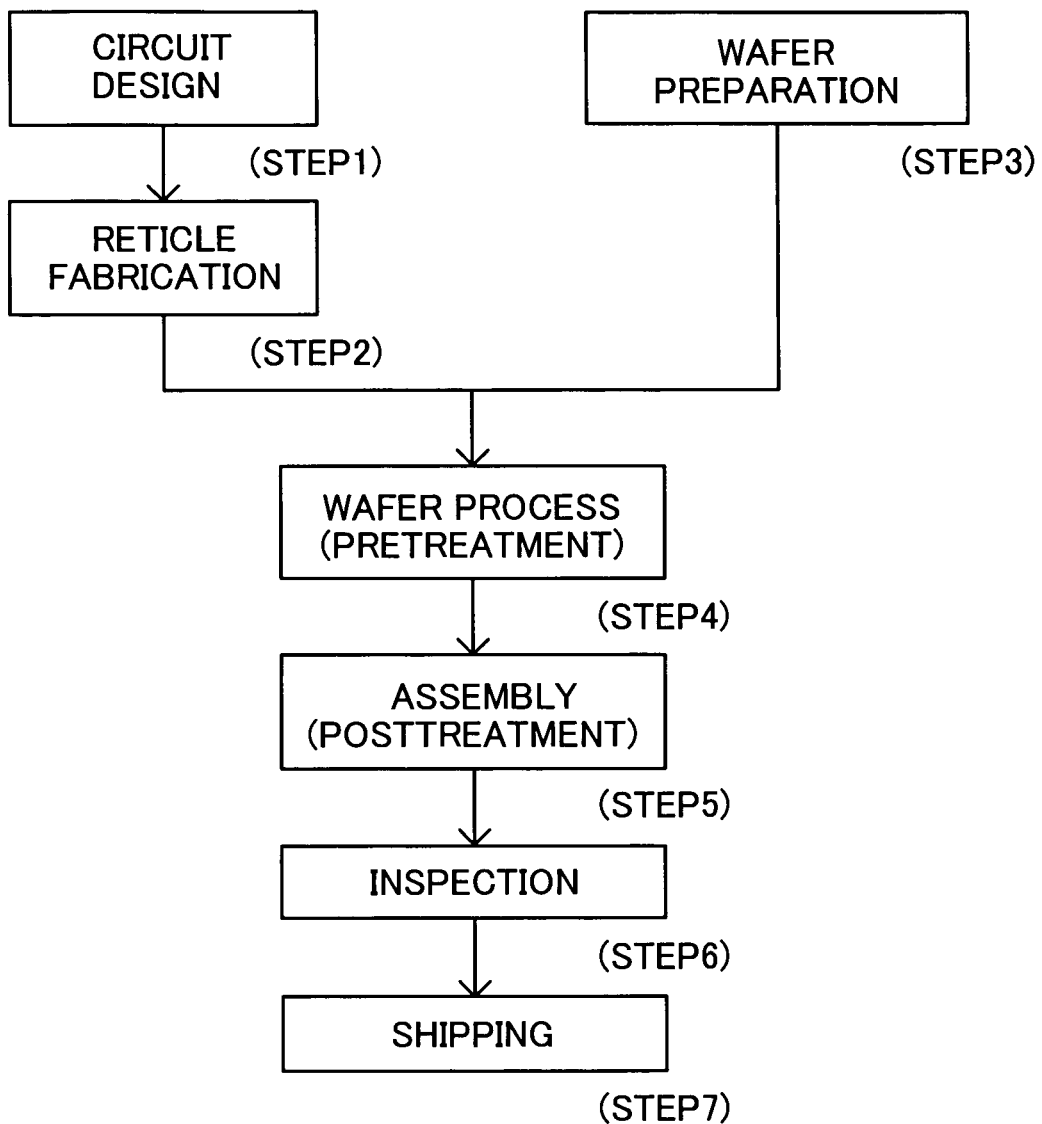
FIG. 10 is a flowchart for explaining how to fabricate devices (such as semiconductor chips such as ICs, LCDs, CCDs, and the like)
Figure 11:
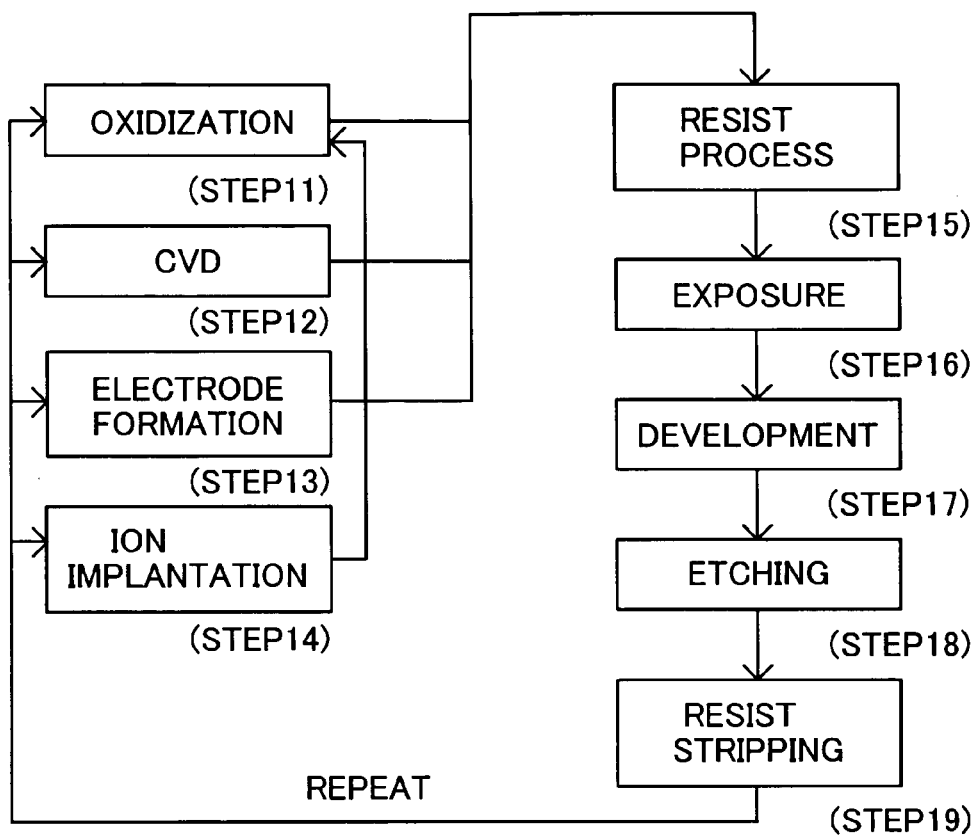
FIG. 11 is a detailed flowchart of a wafer process in Step 4 of FIG. 10.

Referring now to FIGS. 10 and 11, a description will be given of an embodiment of a device fabrication method using the above mentioned exposure apparatus 200. FIG. 10 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern from the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 200, and resultant devices constitute one aspect of the present invention.

Furthermore, the present invention is not limited to these preferred embodiments and various variations and modifications may be made without departing from the scope of the present invention. For example, the present invention can be applied to an exposure apparatus other than the immersion exposure apparatus. Moreover, the present invention can be applied to not only the triple imaging system but a triple or more imaging system.

This application claims a foreign priority benefit based on Japanese Patent Applications No. 2004-305248, filed on Oct. 20, 2004, which is hereby incorporated by reference herein in its entirety as if fully set forth herein.

What is claimed is:

1. A catadioptric projection optical system for forming plural intermediate images of a first object and for imaging the image of the first object onto a second object, said catadioptric projection optical system comprising:
a concave mirror;
a first flat mirror; and
a second flat mirror,
wherein a light reflected by the first flat mirror is directly led to the second flat mirror.

2. A catadioptric projection optical system according to claim 1, wherein said concave mirror is provided at a position opposed to the first object.

3. A catadioptric projection optical system according to claim 1, further comprising an optical element having a refractive power,
wherein said optical element is provided so that an optical axis of the optical element becomes approximately parallel to a gravity direction.

4. An exposure apparatus comprising: an illumination optical system for illuminating a pattern with a light from a light source; and a catadioptric projection system according to claim 1 for projecting the light from the pattern onto an object to be exposed.

5. An exposure apparatus according to claim 4, further comprising a liquid filled in at least part between the object and a lens surface closest to the object of the catadioptric projection optical system.

6. A device fabrication method comprising the steps o:f exposing an object using an exposure apparatus according to claim 4; and performing a development process for the object exposed.

7. A catadioptric projection optical system for forming plural intermediate images of a first object and for imaging the image of the first object onto a second object, said catadioptric projection optical system comprising:
a concave mirror;
a first deflective reflector; and
a second deflective reflector,
wherein only optical elements having a refractive power of 0 are provided in an optical path between the first deflective reflector and the second deflective reflector.

8. An exposure apparatus comprising:
an illumination optical system for illuminating a pattern with a light from a light source; and
a catadioptric projection system according to claim 7 for projecting the light from the pattern onto an object to be exposed.

9. An exposure apparatus according to claim 8, further comprising a liquid filled in at least part between the object and a lens surface closest to the object of the catadioptric projection optical system.

10. A device fabrication method comprising the steps of: exposing an object using an exposure apparatus according to claim 8; and performing a development process for the object exposed.

11. A catadioptric projection optical system as a triple imaging system for forming an intermediate image of a first object twice and for imaging the image of the first object onto a second object, said catadioptric projection optical system comprising, in order from the first object:
- a first lens unit that does not form a reciprocating optical system that an incidence light and reflected light pass;
- a catadioptric unit that forms the reciprocating optical system; and
- a second lens unit that does not form the reciprocating optical system, wherein said catadioptric unit includes:
a third lens unit; and
a concave mirror opposing to the first object,
wherein said third lens unit includes, in order from the first object:
a fourth lens unit having a positive refractive power; and
a fifth lens unit having a negative refractive power,
wherein said catadioptric projection optical system further comprising a first deflective reflector and a second deflective reflector are provided between the concave mirror and the second lens unit.

12. A catadioptric projection optical system according to claim 11, wherein a light reflected by the first deflective reflector is directly led to the second deflective reflector.

13. A catadioptric projection optical system according to claim 11, wherein only an optical element having a refractive power of 0 is provided in an optical path between the first deflective reflector and the second deflective reflector.

14. A catadioptric projection optical system according to claim 11, wherein $4.0<|\beta L1/\beta|<24$ is met, where $\beta L1$ is a paraxial magnification of the first lens unit, and $\beta$ is a paraxial magnification of the catadioptric projection optical system.

15. A catadioptric projection optical system according to claim 11, wherein $0.05<|\beta L3 \times NA|<0.25$ is met, where $\beta L3$ is a paraxial magnification of the second lens unit, and NA is a numerical aperture at a side of the second object.

16. A catadioptric projection optical system according to claim 11, wherein normals of the first and second deflective reflectors from an angle of substantially 90°.

17. A catadioptric projection optical system according to claim 11, wherein said first object and second object are arranged in parallel.

18. A catadioptric projection optical system according to claim 11, wherein the intermediate image closest to the second object is formed between the first and second deflective reflectors.

19. A catadioptric projection optical system according to claim 11, wherein said first to fifth lens unit and catadioptric unit include optical elements so that an optical axis of optical elements become approximately parallel to a gravity direction.

20. An exposure apparatus comprising:
an illumination optical system for illuminating a pattern with a light from a light source; and
a catadioptric projection system according to claim 11 for projecting the light from the pattern onto an object to be exposed.

21. An exposure apparatus according to claim 20, further comprising a liquid filled in at least part between the object and a lens surface closest to the object of the catadioptric projection optical system.

22. A device fabrication method comprising the steps of:
exposing an object using an exposure apparatus according to claim 20; and
performing a development process for the object exposed.

23. A catadioptric projection optical system for forming plural intermediate images of a first object and for imaging the image of the first object onto a second object, said catadioptric projection optical system comprising:
a concave mirror;
a first deflective reflector;
a second deflective reflector;
wherein only an optical element having a refractive power of 0 is provided in an optical path between the first deflective reflector and the second deflective reflector.

24. An exposure apparatus comprising:
an illumination optical system for illuminating a pattern with a light from a light source; and
a catadioptric projection system according to claim 23 for projecting the light from the pattern onto an object to be exposed.

25. An exposure apparatus according to claim 24, further comprising a liquid filled in at least part between the object and a lens surface closest to the object of the catadioptric projection optical system.

26. A device fabrication method comprising the steps of: exposing an object using an exposure apparatus according to claim 24; and performing a development process for the object exposed.

* * * * *

UNITED STATES PATENT AND TRADEMARK OFFICE
CERTIFICATE OF CORRECTION

PATENT NO. : 7,253,971 B2 Page 1 of 1
APPLICATION NO. : 11/255371
DATED : August 7, 2007
INVENTOR(S) : Takashi Kato et al.

It is certified that error appears in the above-identified patent and that said Letters Patent is hereby corrected as shown below:

Column 26, Line 37, change "o:f" to --of:--.

Signed and Sealed this

Eleventh Day of December, 2007

JON W. DUDAS
*Director of the United States Patent and Trademark Office*